[12] United States Patent　　(10) Patent No.: US 10,770,291 B2
Schenker et al.　　(45) Date of Patent: Sep. 8, 2020

(54) METHODS AND MASKS FOR LINE END FORMATION FOR BACK END OF LINE (BEOL) INTERCONNECTS AND STRUCTURES RESULTING THEREFROM

(71) Applicant: Intel Corporation, Santa Clara, CA (US)

(72) Inventors: Richard E. Schenker, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 15/770,955

(22) PCT Filed: Dec. 21, 2015

(86) PCT No.: PCT/US2015/067196
§ 371 (c)(1),
(2) Date: Apr. 25, 2018

(87) PCT Pub. No.: WO2017/111924
PCT Pub. Date: Jun. 29, 2017

(65) Prior Publication Data
US 2018/0315590 A1　　Nov. 1, 2018

(51) Int. Cl.
*H01L 21/4763*　　(2006.01)
*H01L 21/027*　　(2006.01)
(Continued)

(52) U.S. Cl.
CPC ............ *H01L 21/027* (2013.01); *G03F 1/144* (2013.01); *H01L 21/31144* (2013.01); *H01L 21/76816* (2013.01)

(58) Field of Classification Search
CPC ................................ H01L 21/027; G03F 1/144
(Continued)

(56) References Cited

U.S. PATENT DOCUMENTS 6,365,504 B1 * 4/2002 Chien .............. H01L 21/76807
257/E21.579
6,852,620 B2　2/2005 Kim et al.
(Continued)

FOREIGN PATENT DOCUMENTS

JP　2000-357736　12/2000
KR　10-2004-0009864　1/2004

OTHER PUBLICATIONS

International Search Report and Written Opinion for International Patent Application No. PCT/US2015/067196 dated Sep. 19, 2016, 9 pgs.
(Continued)

*Primary Examiner* — Caleb E Henry
(74) *Attorney, Agent, or Firm* — Schwabe, Williamson & Wyatt P.C.

(57) ABSTRACT

Grating based plugs and cuts for feature end formation for back end of line (BEOL) interconnects are described. In an example, a method of fabricating an interconnect structure for a semiconductor die includes forming a hardmask layer above an interlayer dielectric (ILD) material layer. A first patterned hardmask layer is formed above the hardmask layer. A second patterned hardmask layer is formed above the first patterned hardmask layer. A lithographic patterning mask is formed above the second patterned hardmask layer. Portions of the second patterned hardmask layer not protected by the regions of the lithographic patterning mask are removed to form a third patterned hardmask layer and then the lithographic patterning mask is removed. A combined pattern of the third patterned hardmask layer and the first patterned hardmask layer is transferred to the hardmask layer and to the ILD material layer.

20 Claims, 10 Drawing Sheets

(51) Int. Cl.
*G03F 1/00* (2012.01)
*H01L 21/311* (2006.01)
*H01L 21/768* (2006.01)

(58) Field of Classification Search
USPC .................................................... 438/622
See application file for complete search history.

(56) References Cited

U.S. PATENT DOCUMENTS

| | | | |
|---|---|---|---|
| 7,939,445 B1* | 5/2011 | Sutardja | H01L 21/76838 257/E21.575 |
| 8,852,851 B2* | 10/2014 | Zhou | H01L 21/0337 430/311 |
| 8,918,746 B1 | 12/2014 | Yuan et al. | |
| 9,041,217 B1* | 5/2015 | Bristol | H01L 23/528 257/774 |
| 9,054,164 B1* | 6/2015 | Jezewski | H01L 21/76879 |
| 9,236,342 B2* | 1/2016 | Bristol | H01L 23/522 |
| 9,406,512 B2* | 8/2016 | Bristol | H01L 23/528 |
| 9,666,451 B2* | 5/2017 | Wallace | H01L 21/76897 |
| 9,793,163 B2* | 10/2017 | Bristol | H01L 21/76897 |
| 9,793,164 B2* | 10/2017 | Machkaoutsan | H01L 21/76808 |
| 9,911,690 B2* | 3/2018 | Edelstein | H01L 23/5226 |
| 10,269,623 B2* | 4/2019 | Bristol | H01L 21/0335 |
| 10,319,625 B2* | 6/2019 | Nyhus | H01L 21/0337 |
| 10,366,903 B2* | 7/2019 | Lin | H01L 21/32139 |
| 2009/0148795 A1 | 6/2009 | Li et al. | |
| 2009/0200683 A1* | 8/2009 | Colburn | H01L 21/76811 257/774 |
| 2010/0112496 A1* | 5/2010 | Nakajima | G03F 7/40 430/325 |
| 2012/0302057 A1* | 11/2012 | Arnold | H01L 21/0337 438/637 |
| 2012/0313251 A1* | 12/2012 | Kato | H01L 21/76811 257/773 |
| 2013/0126816 A1* | 5/2013 | Tang | H01L 27/2463 257/3 |
| 2015/0093702 A1* | 4/2015 | Nyhus | G03F 7/0392 430/270.1 |
| 2015/0171010 A1* | 6/2015 | Bristol | H01L 23/522 257/774 |
| 2015/0179513 A1* | 6/2015 | Myers | H01L 21/76879 257/774 |
| 2015/0255284 A1* | 9/2015 | Bristol | H01L 23/528 257/774 |
| 2018/0102282 A1* | 4/2018 | Krysak | G03F 7/0045 |
| 2018/0158694 A1* | 6/2018 | Lin | H01L 21/32139 |
| 2018/0323100 A1* | 11/2018 | Nyhus | H01L 21/0337 |

OTHER PUBLICATIONS

International Preliminary Report on Patentablity for International Patent Application No. PCT/US2015/067196, dated Jul. 5, 2018, 6 pages.

* cited by examiner

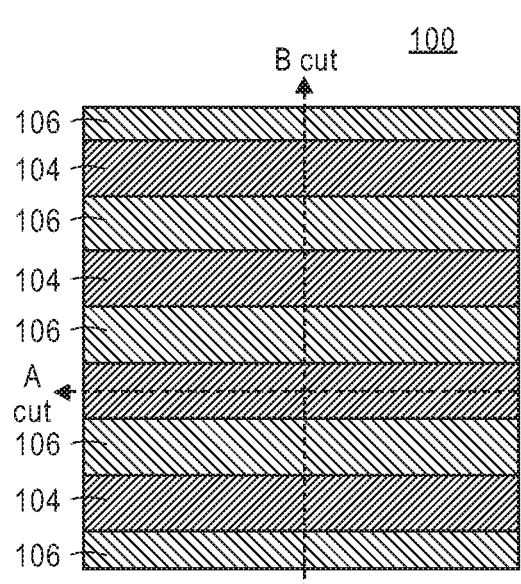
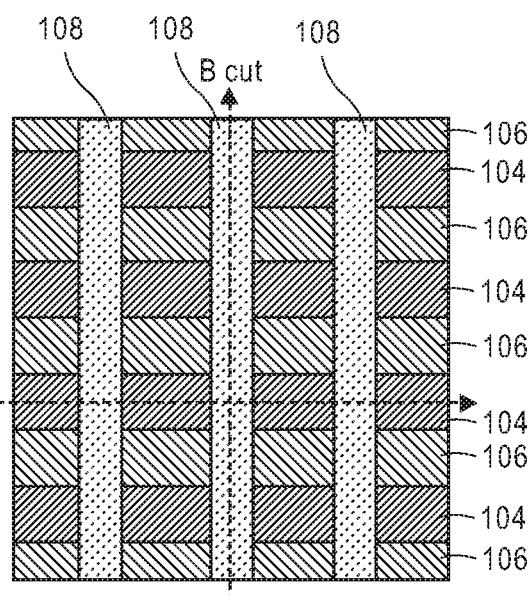
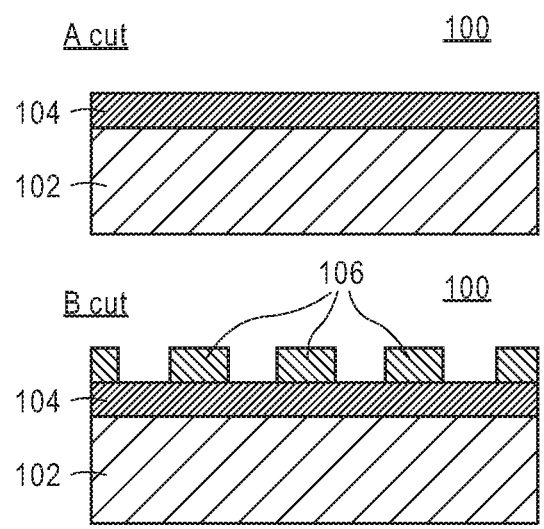
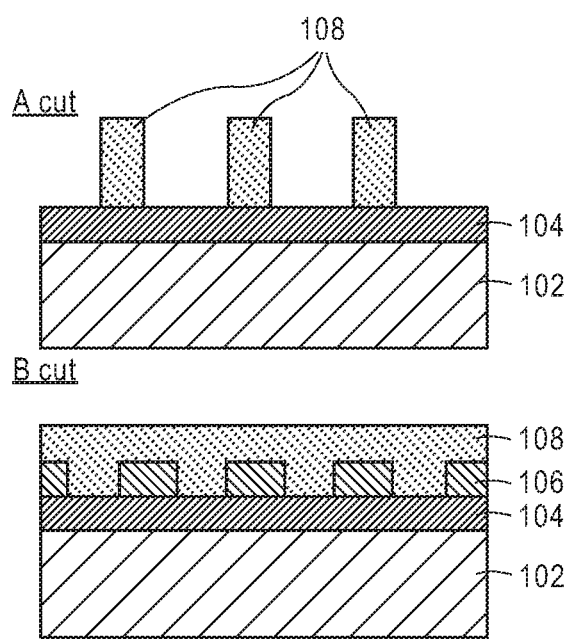
FIG. 1A  FIG. 1B

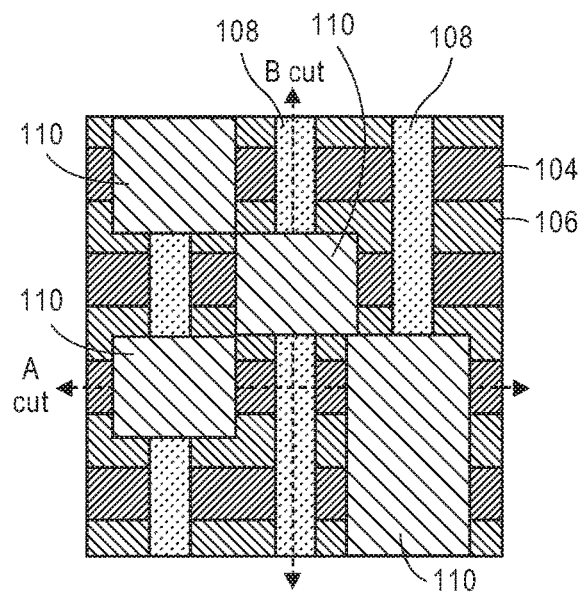
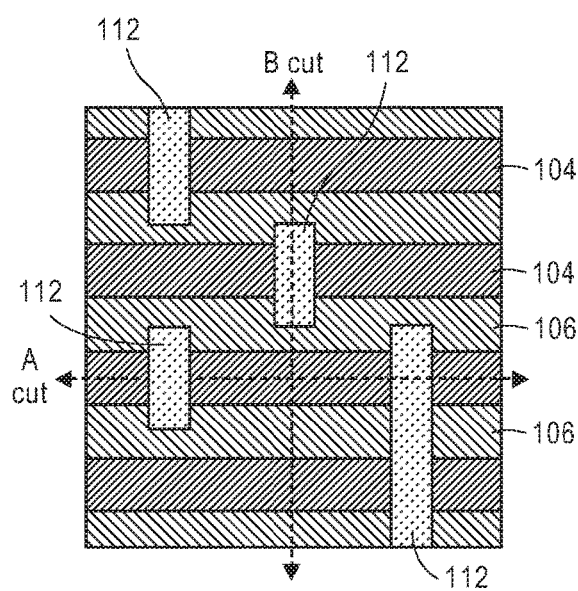
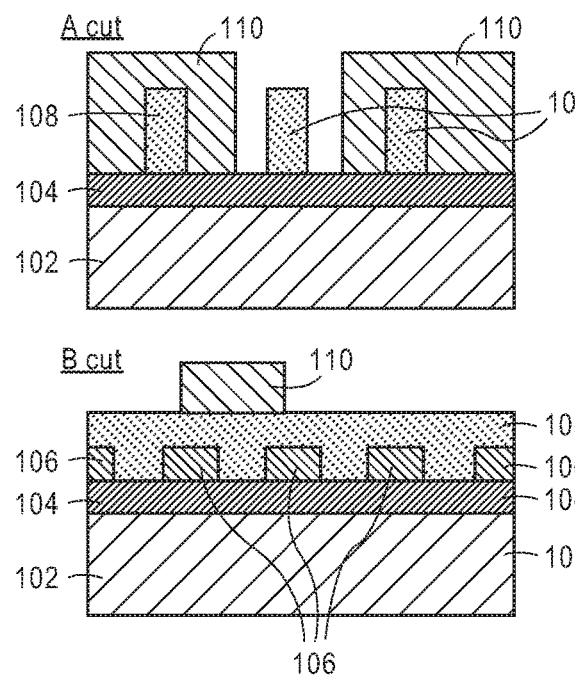
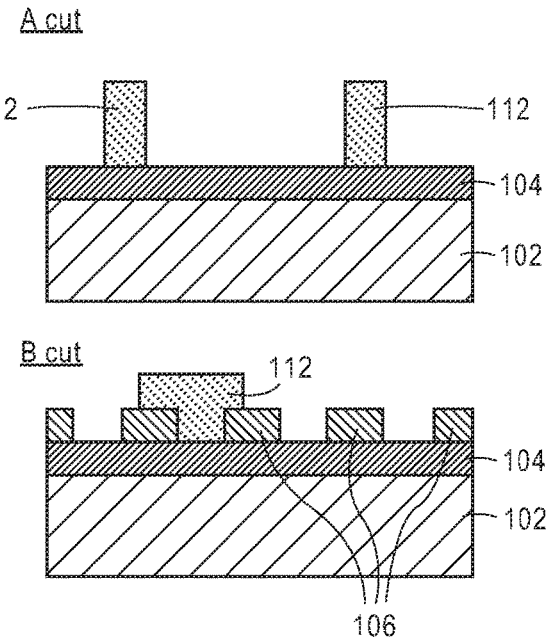
FIG. 1C    FIG. 1D

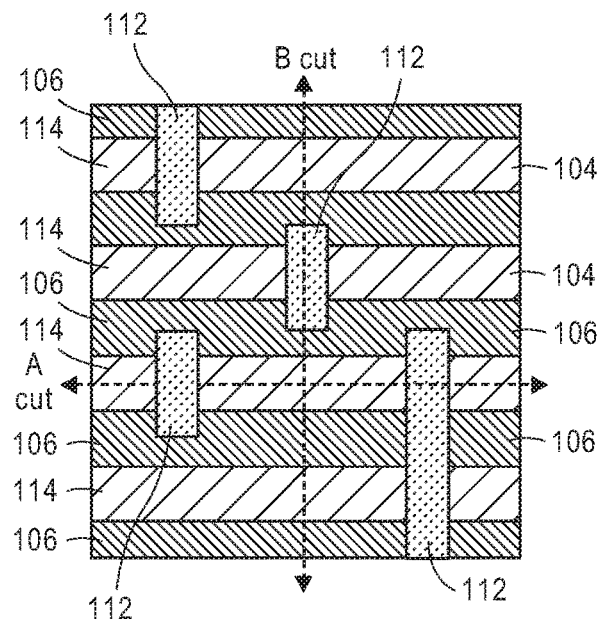
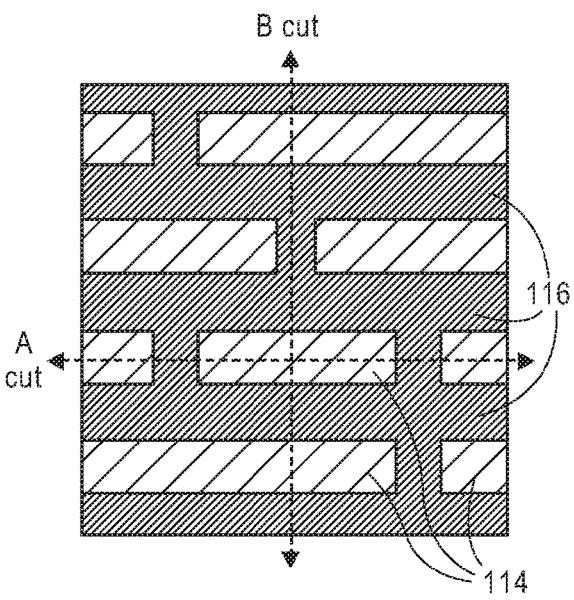
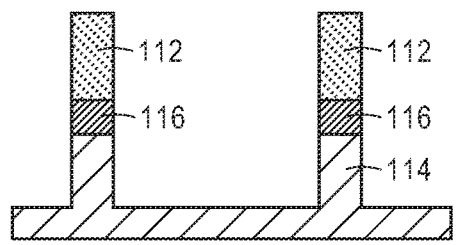
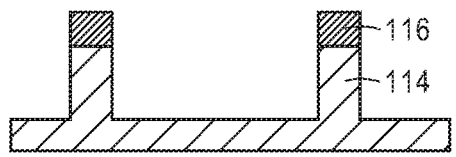
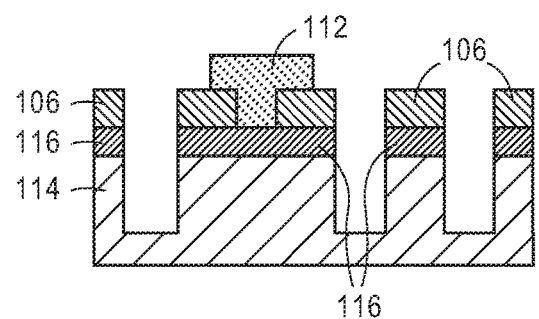
FIG. 1E
FIG. 1F

A cut

B cut

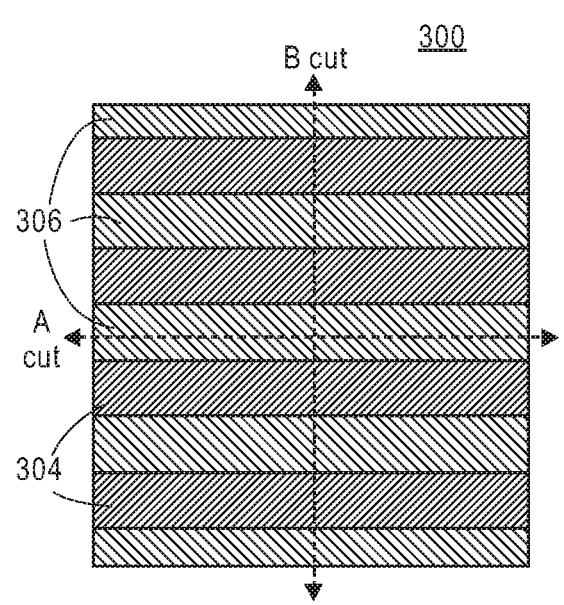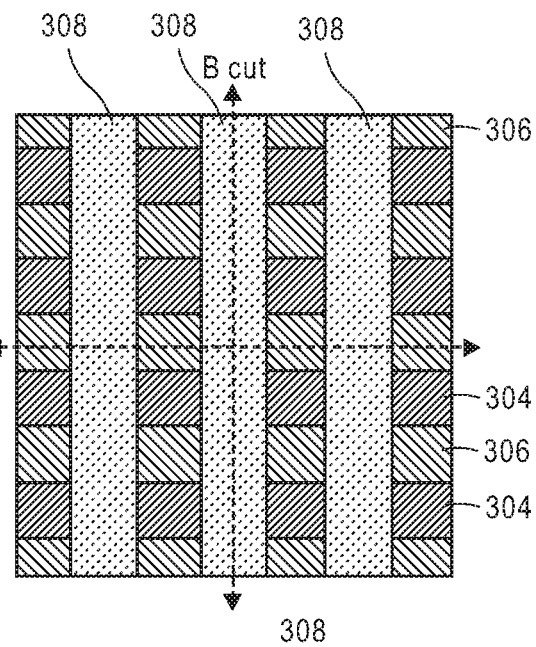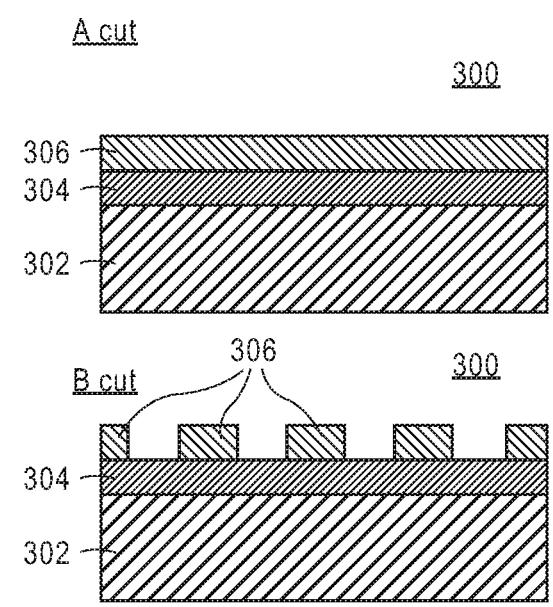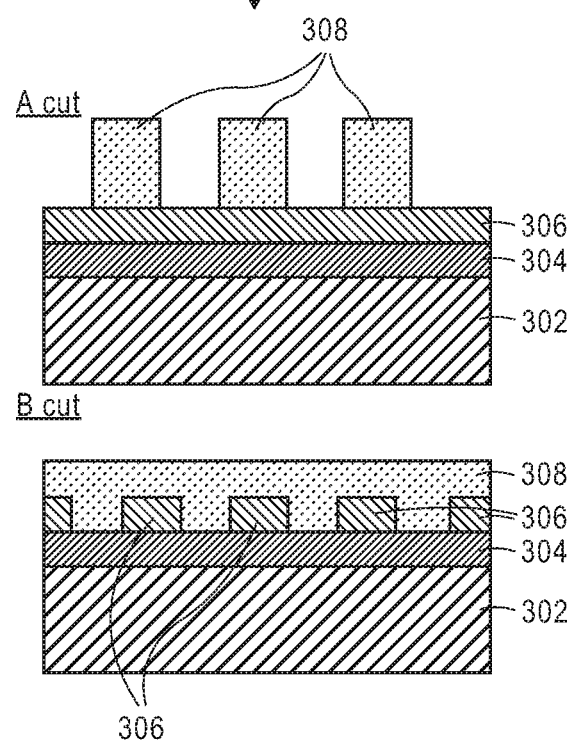
FIG. 3A    FIG. 3B

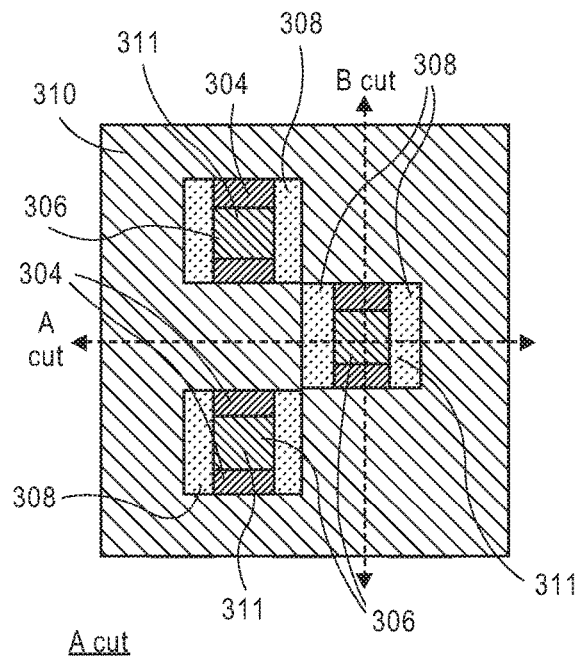
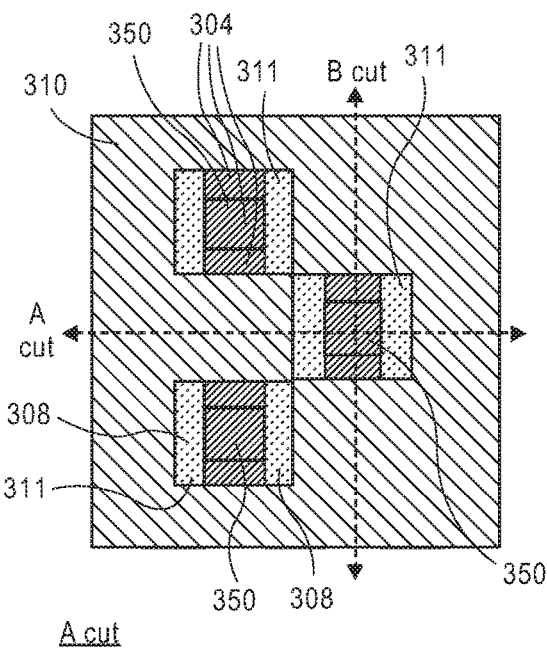
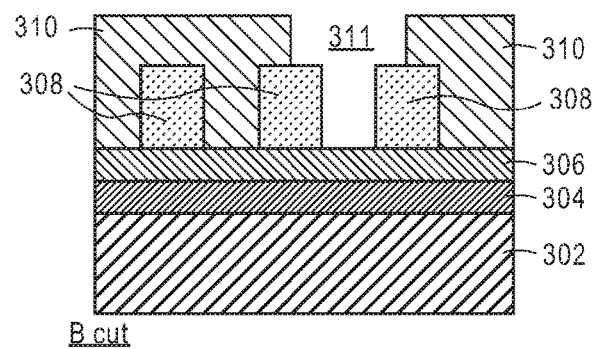
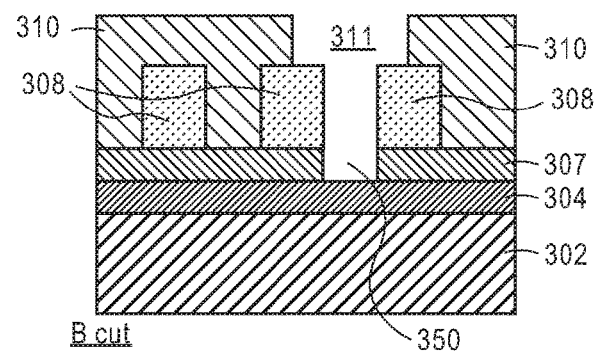
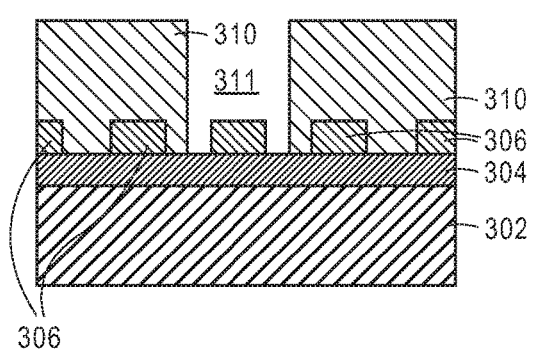
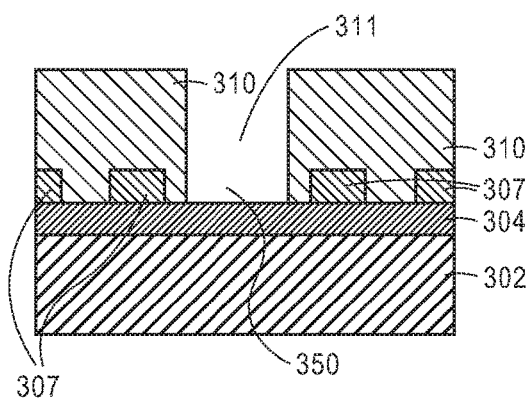
FIG. 3C  FIG. 3D ମETHODS AND MASKS FOR LINE END FORMATION FOR BACK END OF LINE (BEOL) INTERCONNECTS AND STRUCTURES RESULTING THEREFROM

CROSS-REFERENCE TO RELATED APPLICATION

This patent application is a U.S. National Phase Application under 35 U.S.C. § 371 of International Application No. PCT/US2015/067196, filed Dec. 21, 2015, entitled "GRATING BASED PLUGS AND CUTS FOR FEATURE END FORMATION FOR BACK END OF LINE (BEOL) INTERCONNECTS AND STRUCTURES RESULTING THEREFROM," which designates the United States of America, the entire disclosure of which is hereby incorporated by reference in its entirety and for all purpose.

TECHNICAL FIELD

Embodiments of the invention are in the field of semiconductor structures and processing and, in particular, grating based plugs and cuts for feature end formation for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. It is to be appreciated that with scaling to smaller vias, scaling to smaller non-conductive spaces or interruptions between metals lines (referred to as "line ends," "plugs" or "cuts") connected by vias may also need to be performed.

When patterning extremely small line ends (plugs or cuts) with extremely small pitches by such lithographic processes, several challenges present themselves, especially when the pitches are around 70 nanometers (nm) or less and/or when the critical dimensions of the line ends are around 35 nm or less. Also, as line end pitches scale ever smaller over time, the overlay tolerances tend to scale with them at an even greater rate than lithographic equipment is able to keep up.

Another such challenge is that the critical dimensions of the line ends generally tend to scale faster than the resolution capabilities of the lithographic scanners. Shrink technologies exist to shrink the critical dimensions of the line ends. However, the shrink amount tends to be limited by the minimum line end pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the line ends decrease in order to maintain the same overall fraction of the critical dimension budget. However, currently the LWR and/or CDU characteristics of most photoresists are not improving as rapidly as the critical dimensions of the line ends are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print line ends for these extremely small pitches using EUV scanners.

Thus, improvements are needed in the area of line end manufacturing technologies.

BRIEF DESCRIPTION OF THE DRAWINGS

FIGS. 1A-1G illustrate plan views and corresponding cross-sectional views representing various operations in a method of fabricating grating based plugs and cuts for feature end formation for back end of line (BEOL) interconnects, in accordance with an embodiment of the present invention.

FIGS. 3A-3F illustrate plan views and corresponding cross-sectional views representing various operations in a method of fabricating grating based plugs and cuts for feature end formation for back end of line (BEOL) interconnects, in accordance with an embodiment of the present invention.

DESCRIPTION OF THE EMBODIMENTS

Figure 1G:
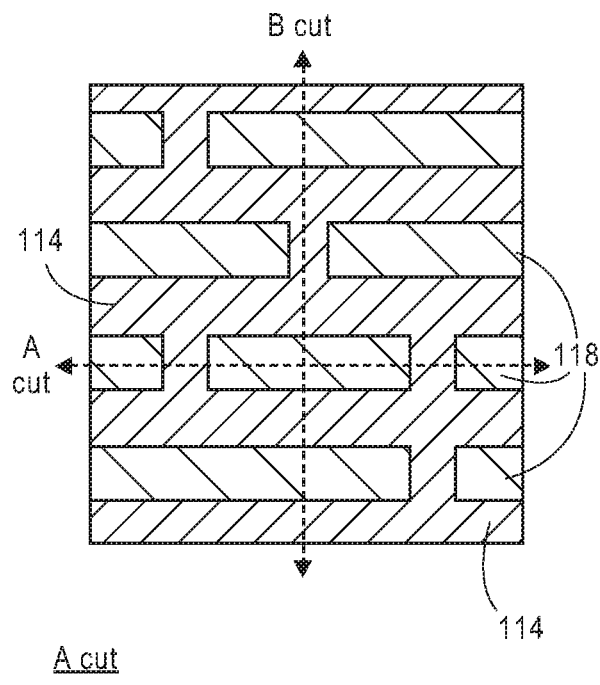
Figure 1G:
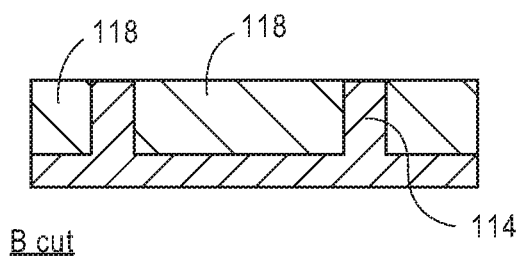
Figure 1G:
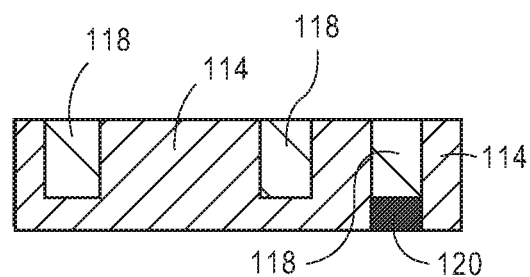

Grating based plugs and cuts for feature end formation for back end of line (BEOL) interconnects are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to grating based plugs and cuts for feature end formation. Embodiments may involve one or more of lithography patterning, associated line-end CD yield, and spacer-based patterning. Embodiments employ methods to create plugs and cuts with placement control and uniformity of one dimensional (1D) features. It is to be appreciated that there is trade-off between better control for line ends (plugs) or via placements with the implication that via and line ends are placed at more restricted locations.

To provide context for embodiments described herein, in order to enable patterning tighter pitch features in semiconductor manufacturing, grating and plug or grating and cut approaches are being applied to more layers. As feature dimensions continue to shrink, the ability to robustly pattern cuts and plugs can limit scaling and yield. Cut and plug features are generally defined directly by a lithographic operation with primarily two dimensional (2D) features. Such 2D features have much higher variation and non-uniformity than one dimensional (1D) features.

In an aspect, then, one or more embodiments described herein are directed to an approach that employs an underlying metal grating structure as a template to build overlying non-conductive spaces or interruptions between metals lines (referred to as "line ends," "plugs" or "cuts"). It is to be appreciated that similar approaches may be implemented to fabricate vias, which by definition, are used to land on a previous layer metal pattern. In this vein, embodiments described herein enable a more robust interconnect fabrication scheme since alignment by lithography equipment is relied on to a lesser extent. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

It is to be appreciated that a pattern needed to select a pre-formed line end or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

With respect to FIGS. 1A-1G described below, in an embodiment, an overview of a simplified patterning process to generate grating defined plugs is presented. A sacrificial 1D pattern is generated orthogonal to a primary direction of a layer being patterned. A selection mask is then used to cut or keep the portions of the 1D pattern that will ultimately be used to cut or keep portions of the primary grating. The final edges of the cut/keep on the primary pattern are thus defined by edges of the 1D sacrificial grating, with much better control and uniformity.

In a first exemplary processing scheme, FIGS. 1A-1G illustrate plan views (upper) and corresponding cross-sectional views (middle and lower) representing various operations in a method of fabricating grating based plugs and cuts for feature end formation for back end of line (BEOL) interconnects.

Referring to FIG. 1A, a starting point structure 100 is provided as a beginning point for fabricating a new metallization layer. The starting point structure 100 includes an interlayer dielectric (ILD) material layer 102 having a first hardmask layer 104 formed thereon. A second hardmask layer 106 is formed on the first hardmask layer 104. The second hardmask layer 106 has a grating pattern, which may be viewed as a primarily one dimensional (1D) grating pattern. In an embodiment, the grating pattern of the second hardmask 106 is ultimately used to define 1D locations of the final layer to be patterned but does not yet have the end of feature positions patterned therein. First hardmask layer 104 and/or second hardmask layer 106 may be fabricated from a material such as, but not limited to, silicon nitride (SiN), silicon oxide ($SiO_2$), titanium nitride (TiN), or silicon (Si). In one embodiment, first hardmask layer 104 and second hardmask layer 106 are fabricated from different materials from one another.

Referring to FIG. 1B, a third hardmask layer 108 is formed on the structure of FIG. 1A. In an embodiment, the third hardmask layer 108 has a grating pattern, which may be viewed as a primarily one dimensional (1D) grating pattern orthogonal to the 1D grating pattern of the second hardmask layer 106. The third hardmask layer 108 may be fabricated from a material such as, but not limited to, silicon nitride (SiN), silicon oxide ($SiO_2$), titanium nitride (TiN), or silicon (Si). In one embodiment, the third hardmask layer 108 is fabricated from a material different than the materials of the first hardmask layer 104 and the second hardmask layer 106. It is to be appreciated that any one of the hardmask layers described above may actually include a plurality of sublayers, e.g., to provide improved etch selectivity.

In an embodiment, the grating pattern of the third hardmask layer 108 and the grating pattern of the second hardmask layer 106 together define all allowed line end locations for a metal line metallization layer. In one such embodiment, the grating pattern of the third hardmask layer 108 and the grating pattern of the second hardmask layer 106 together define line end locations at locations where the lines of the grating patterns overlap. In another such embodiment, the grating pattern of the third hardmask layer 108 and the grating pattern of the second hardmask layer 106 together define line end locations at locations where spaces are exposed between lines of the grating patterns.

Referring to FIG. 1C, regions of a lithographic patterning mask 110 are formed on the structure of FIG. 1B. The regions of the lithographic patterning mask 110 may be formed from a photo-resist layer or layers, or like lithographic patterning mask. In an embodiment, the regions of the lithographic patterning mask 110 provide a pattern of cut/keep regions on the sacrificial grating formed from the second hardmask layer 106 and the third hardmask layer 108. In an embodiment, then, a lithography process is used to select (cut or keep) portions of the sacrificial grating which will eventually define the end locations of a primary pattern of metal lines. In one such embodiment, 193 nm or EUV lithography is used together with an etch transferring of the resist pattern into underlying layers prior to etching the sacrificial grating pattern. In one embodiment, the lithographic process involves multiple exposures of resist layers or deposition/etch/deposition repetitive processing. It is to be appreciated that the masked regions may be referred to as cutting or keeping locations, where the orthogonal grating overlap regions or spaces between gratings are used to define plug (or perhaps via) locations.

Referring to FIG. 1D, using the regions of the lithographic patterning mask 110 of the structure of FIG. 1C as a mask, the third hardmask layer 108 is selectively etched to form patterned hardmask layer 112. That is, a portion of the sacrificial grating is etched to take on portions of the pattern of the regions of the lithographic patterning mask 110 that protect portions of the third hardmask layer 108 from an etching process. In an embodiment, the portions of the third hardmask layer 108 that are removed in the etch process are not part of the final target design. In an embodiment, the regions of the lithographic patterning mask 110 are removed subsequent to forming the patterned hardmask layer 112, as is depicted in FIG. 1D.

Referring to FIG. 1E, a combined pattern formed the second hardmask layer 106 and the patterned hard mask layer 112 of the structure of FIG. 1D is transferred into the first hardmask layer 104 and into the ILD material layer 102, e.g., by a selective etch process. The patterning forms a patterned ILD layer 114 and a patterned hardmask layer 116.

Referring to FIG. 1F, the patterned hard mask layer 112 and the second hardmask layer 106 (i.e., the sacrificial grating) of the structure of FIG. 1E is then removed. The patterned hardmask layer 116 may be retained at this stage, as is depicted in FIG. 1F, or may be removed. Selective wet or dry processing techniques can be employed for removal of the patterned hard mask layer 112 and the second hardmask layer 106 (and, possibly, the patterned hardmask layer 116). It is to be appreciated that the resulting structure of FIG. 1F can subsequently be used as a starting point for metal fill with the option of first removing the remaining patterned hardmask layer 116. The end locations (line ends) of what will be metal features are defined by the edges of the 1D sacrificial grating transferred in to the ILD material layer 102 and, hence, are well controlled.

Referring to FIG. 1G, a metal fill process is performed on the structure of FIG. 1F to form metal lines 118 in the openings patterned ILD layer 114. The metal lines have lines ends formed by the breaks in continuity formed in the patterned ILD layer 114. In an embodiment, the metal fill process is performed by depositing and then planarizing one or more metal layers over the patterned ILD layer 114. The patterned hardmask layer 116 may be retained during the metal deposition process and then removed during the planarization process, as is depicted in FIGS. 1F and 1G. However, in other embodiments, the patterned hardmask layer 116 is removed prior to the metal fill process. In still other embodiments, the patterned hardmask layer 116 is retained in the final structure. Referring again to FIG. 1G, it is to be appreciated that the metal lines 118 may be formed over underlying features, such, as conductive via 120 shown as an example.

A resulting structure such as described in association with FIG. 1G may subsequently be used as a foundation for forming subsequent metal line/via and ILD layers. Alternatively, the structure of FIG. 1G may represent the final metal interconnect layer in an integrated circuit. It is to be appreciated that the above process operations may be practiced in alternative sequences, not every operation need be performed and/or additional process operations may be performed. In an embodiment, offset due to conventional lithograph/dual damascene patterning that must otherwise be tolerated, is not a factor for the resulting structures described herein. It is to be appreciated that the above examples have focused on line end/plug/cut formation or preservation. However, in other embodiments, similar approaches may be used to form vias/contacts above or below a metal line layer. It is also to be appreciated that, in subsequent fabrication operations, the dielectric lines may be removed to provide air gaps between the resulting metal lines.

Referring again to FIGS. 1A-1G, in an embodiment, a patterning process to generate grating defined plugs has been described. The advantages of such an embodiment may include better dimensional control of end-to-end features that reduces the probability of end-to-end shorting (yield failure) otherwise observed under conditions of worst case process variation. Improved dimensional control of end-to-end features provides more area under worse case process variation for via landing and coverage. Accordingly, in an embodiment, improved electrical connection may be achieved from layer to layer, with increased yield and product performance. Improved dimensional control of end-to-end features can enable smaller end-to-end widths and, therefore, better product density (cost per functionality) may be achieved.

In embodiment, an advantage of embodiments of the present invention is that all the line-end locations are defined by a single lithography operation. For example, when plug/cut pitches become very small the common solution is to use multiple passes of lithography with additional processing to generate a composite plug/cut pattern. By contrast, in embodiments described herein, the feature-end locations are a function of multiple lithography operations and, hence, have larger variation than when a single lithography operation is used to define the feature-end as is the case with embodiments described herein.

In another embodiment, a sacrificial grating is defined by a spacer based process. Since the grating size is defined by a thin film operation instead of an optical process, dimensional control is generally much improved. Spacer based processing lends itself well to small dimensions and the size is not defined optically.

FIGS. 2A-2D illustrate cross-sectional views representing various operations in a method of fabricating grating based plugs and cuts for feature end formation for back end of line (BEOL) interconnects, in accordance with an embodiment of the present invention.

Figure 2A:
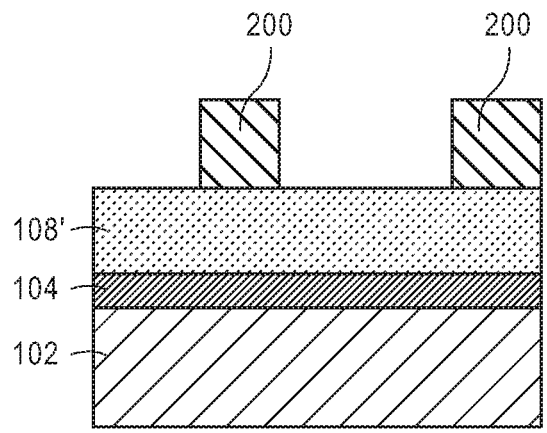
FIGS. 2A-2D illustrate cross-sectional views representing various operations in a method of fabricating grating based plugs and cuts for feature end formation for back end of line (BEOL) interconnects, in accordance with an embodiment of the present invention.

Referring to FIG. 2A, a starting point structure includes an interlayer dielectric (ILD) material layer 102 having a first hardmask layer 104 formed thereon. A second hardmask layer 108' is formed on the first hardmask layer 104. The second hardmask layer 108' is not patterned at this stage. A grating backbone structure 200 is formed on the second hardmask layer 108', which has a direction orthogonal to a primary direction ultimately patterned in the interlayer dielectric (ILD) material layer 102.

Figure 2B:
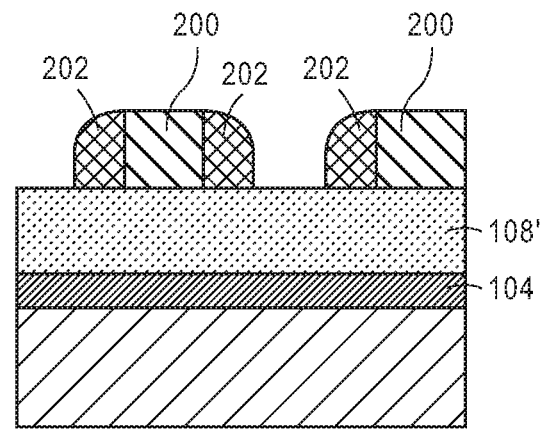

Referring to FIG. 2B, spacers 202 are formed adjacent to the sidewalls of the features of the grating backbone structure 200. In an embodiment, the spacers 202 are formed by first forming a blanket spacer material layer. The blanket spacer material is then etched with a selective anisotropic etch to form spacers 202.

Figure 2C:
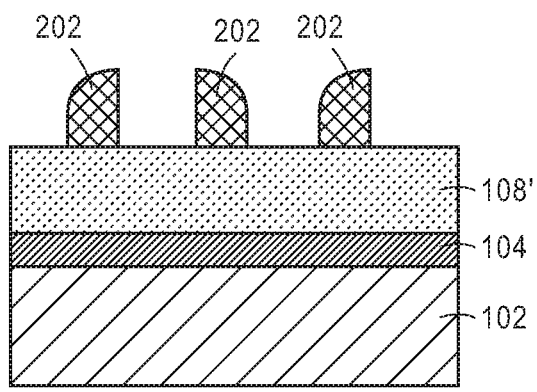

Referring to FIG. 2C, the grating backbone structure 200 is removed to leave only spacers 202 above the second hardmask layer 108'. In one embodiment, the grating backbone structure 200 is removed using a selective wet etch process. In another embodiment, the grating backbone structure 200 is removed using a selective dry etch process.

Figure 2D:
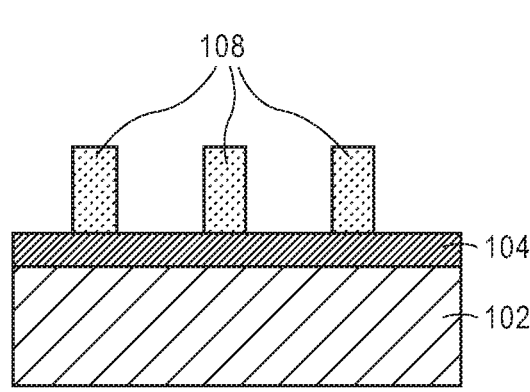

Referring to FIG. 2D, the pattern of the spacers 202 is transferred into the second hardmask layer 108' to form patterned hardmask layer 108 having a grating structure. The spacers 202 may subsequently be removed, as is also illustrated in FIG. 2D. The patterned hardmask layer 108 may have properties, and may play a role in patterning, similar to the above described role of hardmask layer 108 described in association with FIG. 1A-1G. In one such embodiment, the direction of the grating structure of the patterned hardmask layer 108 is orthogonal to a primary direction of an ultimately patterned ILD material layer having a metal line grating structure formed therein.

In another embodiments, as described below in association with FIGS. 3A-3F, an opposite tone approach is implemented. In this case, the end-to-end features are defined with cuts instead of plugs. Operations (1) and (2) are the same as described above. Operation (3) shows how a cut mask can be used in conjunction with the sacrificial grating to define where the primary grating ends will be defined. The sacrificial grating edges are not etched but instead are used as sidewalls to define the final primary feature line ends. Operation (4) illustrates a second etch of an upper grating hardmask. The new HM1 pattern can then transferred into the final material to be used in the process stack.

More particularly, in a second exemplary processing scheme, FIGS. 3A-3F illustrate plan views (upper) and corresponding cross-sectional views (middle and lower) representing various operations in a method of fabricating grating based plugs and cuts for feature end formation for back end of line (BEOL) interconnects.

Referring to FIG. 3A, a starting point structure 300 is provided as a beginning point for fabricating a mask for forming a new metallization layer. The starting point structure 300 includes a subtractive material layer 302. In a specific embodiment, the subtractive material layer 302 is s polycrystalline silicon material that will ultimately provide a sacrificial mask material. In other embodiments, however, layer 302 is an ILD layer that is ultimately patterned and retained in a final metallization structure. A first hardmask layer 304 is formed on the subtractive material layer 302. A second hardmask layer 306 is formed on the first hardmask layer 304. The second hardmask layer 306 has a grating pattern, which may be viewed as a primarily one dimensional (1D) grating pattern. In an embodiment, the grating pattern of the second hardmask 306 is ultimately used to define 1D locations of the final layer to be patterned but does not yet have the end of feature positions patterned therein. First hardmask layer 304 and/or second hardmask layer 306 may be fabricated from a material such as, but not limited to, silicon nitride (SiN), silicon oxide (SiO$_2$), titanium nitride (TiN), or silicon (Si). In one embodiment, first hardmask layer 304 and second hardmask layer 306 are fabricated from different materials from one another.

Referring to FIG. 3B, a third hardmask layer 308 is formed on the structure of FIG. 3A. In an embodiment, the third hardmask layer 308 has a grating pattern, which may be viewed as a primarily one dimensional (1D) grating pattern orthogonal to the 1D grating pattern of the second hardmask layer 306. The third hardmask layer 308 may be fabricated from a material such as, but not limited to, silicon nitride (SiN), silicon oxide (SiO$_2$), titanium nitride (TiN), or silicon (Si). In one embodiment, the third hardmask layer 308 is fabricated from a material different than the materials of the first hardmask layer 304 and the second hardmask layer 306. It is to be appreciated that any one of the hardmask layers described above may actually include a plurality of sublayers, e.g., to provide improved etch selectivity.

In an embodiment, the grating pattern of the third hardmask layer 308 and the grating pattern of the second hardmask layer 306 together define all allowed line end locations for a metal line metallization layer. In one such embodiment, the grating pattern of the third hardmask layer 308 and the grating pattern of the second hardmask layer 306 together define line end locations at locations where the lines of the grating patterns overlap. In another such embodiment, the grating pattern of the third hardmask layer 308 and the grating pattern of the second hardmask layer 306 together define line end locations at locations where spaces are exposed between lines of the grating patterns.

Referring to FIG. 3C, a patterned lithographic mask 310 having openings 311 formed therein is formed on the structure of FIG. 3B. The patterned lithographic mask 310 may be formed from a photo-resist layer or layers, or like lithographic patterning mask. In an embodiment, the openings 311 of the patterned lithographic mask 310 provide a pattern of cut/keep regions on the sacrificial grating formed from the second hardmask layer 306 and the third hardmask layer 308. In an embodiment, then, a lithography process is used to select (cut or keep) portions of the sacrificial grating which will eventually define the end locations of a primary pattern of metal lines. In one such embodiment, 193 nm or EUV lithography is used together with an etch transferring of the resist pattern into underlying layers prior to etching the sacrificial grating pattern. In one embodiment, the lithographic process involves multiple exposures of resist layers or deposition/etch/deposition repetitive processing. It is to be appreciated that the openings 311 may be referred to as cutting or keeping locations, where the orthogonal grating overlap regions or spaces between gratings are used to define plug (or perhaps via) locations.

Referring to FIG. 3D, using the patterned lithographic mask 310 of the structure of FIG. 3C as a mask, the second hardmask layer 306 is selectively etched to form patterned hardmask layer 307. In particular, the portions of the second hardmask layer 306 exposed by openings 311 are removed. The portions of the third hardmask layer 308 exposed by the openings 311 confine the etch to only those portions of the second hardmask layer 306 exposed by openings 311 and not covered by third hardmask layer 308. That is, a portion of the sacrificial grating is etched to take on confined portions of the pattern of the openings 311. The etch process of FIG. 3D provides a definition of cut locations in patterned hardmask layer 307.

Figures 3E, 3F:
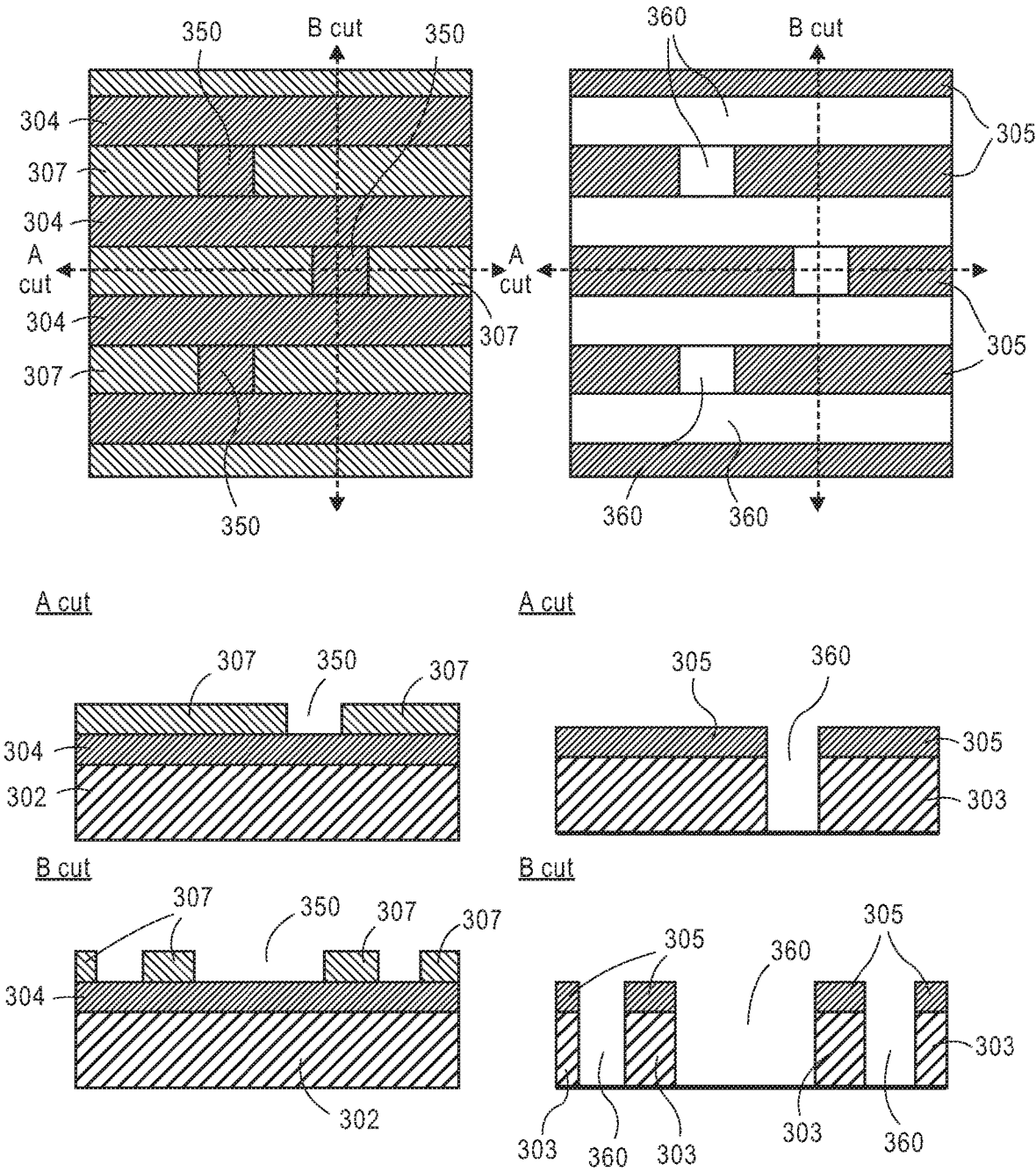

Referring to FIG. 3E, the patterned lithographic mask 310 and the third hardmask layer 308 (i.e., portions of the sacrificial grating) of the structure of FIG. 3D are then removed. The patterned hardmask layer 307 is retained at this stage. Selective wet or dry processing techniques can be employed for removal of the patterned lithographic mask 310 and the second hardmask layer 308.

Referring to FIG. 3F, the pattern of the patterned hardmask layer 307 of the structure of FIG. 3D is transferred into the first hardmask layer 304 and into the subtractive material layer 302, e.g., by a selective etch process. The patterning forms a patterned subtractive material layer 303 with openings 360 and a patterned hardmask layer 305. The patterned hardmask layer 307 is then removed.

In the case that subtractive material layer 302 is a sacrificial mask layer, the pattern shown in FIG. 3F may be transferred to an underlying permanent ILD layer. However, in other embodiments, the subtractive material layer 302 is a permanent ILD layer, and metal lines are subsequently formed in the structure of FIG. 3F, in a manner similar to that described in association with FIGS. 1F and 1G. That is, in an embodiment, the resulting structure of FIG. 3F can subsequently be used as a starting point for metal fill with the option of first removing the remaining patterned hardmask layer 305. The end locations (line ends) of what will be metal features are defined by the edges of the 1D sacrificial grating transferred in to the subtractive material layer 302 and, hence, are well controlled.

A resulting structure such as a metal filled structure of FIG. 3F, or a structure formed using the structure of FIG. 3F as a mask, may subsequently be used as a foundation for forming subsequent metal line/via and ILD layers. Alternatively, the structure may represent the final metal interconnect layer in an integrated circuit. It is to be appreciated that the above process operations may be practiced in alternative sequences, not every operation need be performed and/or additional process operations may be performed. In an embodiment, offset due to conventional lithograph/dual damascene patterning that must otherwise be tolerated, is not a factor for the resulting structures described herein. It is to be appreciated that the above examples have focused on line end/plug/cut formation or preservation. However, in other embodiments, similar approaches may be used to form vias/contacts above or below a metal line layer. It is also to be appreciated that, in subsequent fabrication operations, the dielectric lines may be removed to provide air gaps between the resulting metal lines.

Referring again to FIGS. 3A-3F, in an embodiment, the approach may be used with either subtractive or damascene patterning of the final layer. Likewise, the method can employ either the sacrificial grating line or sacrificial grating spacings to define the final end to end location of the primary layer. In some cases, a tone reversal method is employed to select whether the line or space of the sacrificial grating is used to define the break in the main features. Such a consideration can be important when the sacrificial grating is generated with a spacer based process as then the line width would be generally limited to one size (e.g., as defined by a thin film deposition operation).

Referring to both general processing schemes described above, in an embodiment, if a sacrificial grating is defined with a spacer based method, an implemented design may show forced gridded only line-end locations. Wafers may also show such a gridded line-end pattern. For wide primary feature, line-ends may be less rounded as viewed top down when approached described herein are implemented. Line-end size uniformity may be improved by implementing approaches described herein. Benefits may include providing for semiconductor chip density scaling at high manufacturing yields. Benefits may include providing for dense interconnects and transistors with consistently well-formed line ends (e.g., improved starting and more reliable electrical performance).

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium (e.g., titanium nitride) or another metal. Potentially lesser amounts of other materials, such as oxygen, may be included in one or more of these layers. Alternatively, other hardmask layers known in the art may be used depending upon the particular implementation. The hardmask layers maybe formed by CVD, PVD, or by other deposition methods.

It is to be appreciated that the layers and materials described in association with FIGS. 1A-1G and 3A-3F are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1G or 3F may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach (i.e., some aspect of pitch division). In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (193i), EUV and/or EBDW lithography, directed self-assembly, etc.

In an embodiment, lithographic operations are performed using 193 nm immersion litho (193i), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

To provide further context for the above described embodiments, patterning and aligning of features at less than approximately 50 nanometer pitch requires many reticles and critical alignment strategies that are extremely expensive for a semiconductor manufacturing process. Generally, embodiments described herein involve the fabrication of metal and line end patterns based on the positions of overlying orthogonal grating structures which may be in alignment with an underlying layer. Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
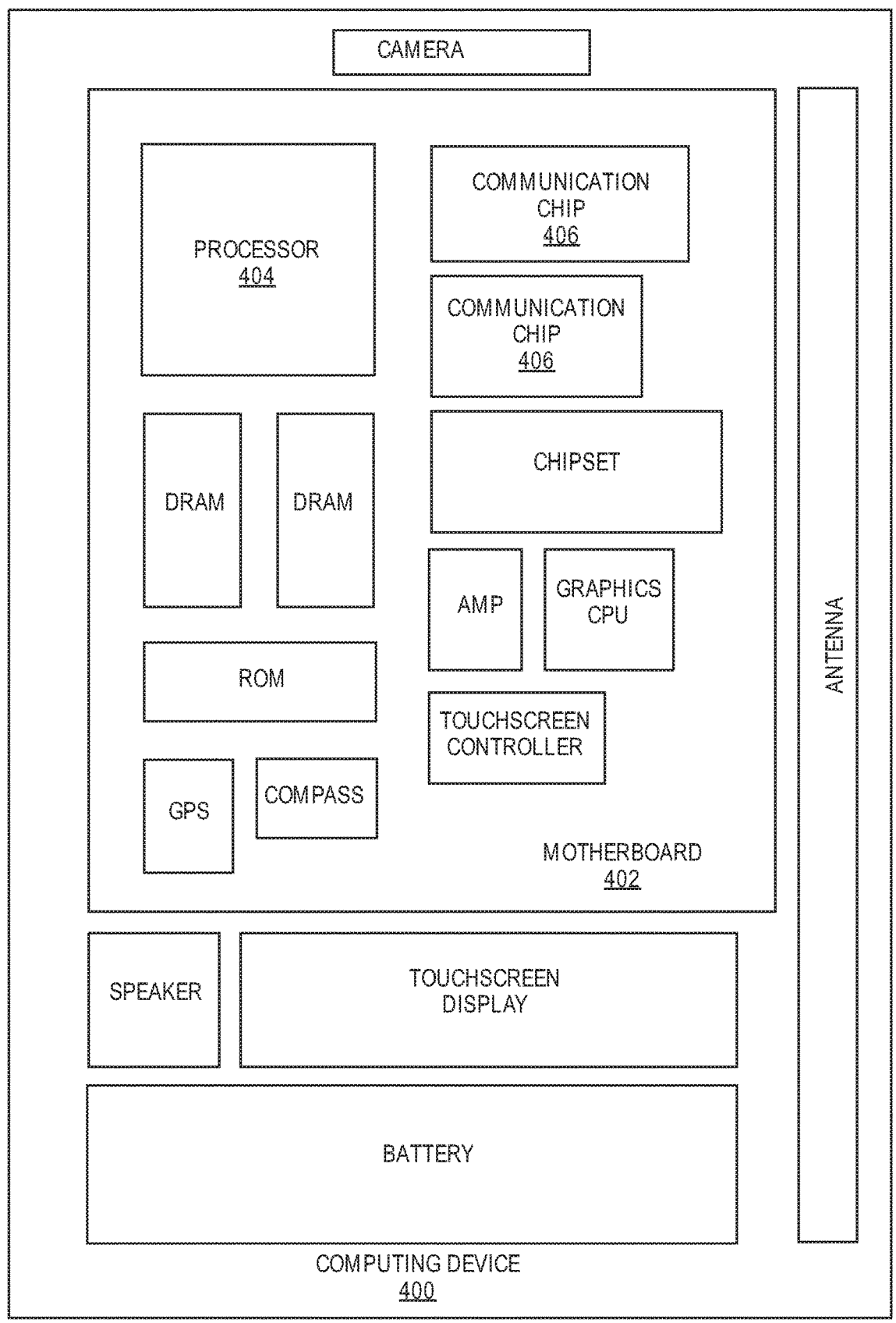
FIG. 4 illustrates a computing device in accordance with one implementation of an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of embodiments of the invention, the integrated circuit die of the processor includes one or more structures, such as metal interconnect layers having metal line ends (plugs or cuts) built in accordance with implementations of embodiments of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of embodiments of the invention, the integrated circuit die of the communication chip includes one or more structures, such as metal interconnect layers having metal line ends (plugs or cuts) built in accordance with implementations of embodiments of the invention.

In further implementations, another component housed within the computing device 400 may contain an integrated circuit die that includes one or more structures, such as metal interconnect layers having metal line ends (plugs or cuts) built in accordance with implementations of embodiments of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
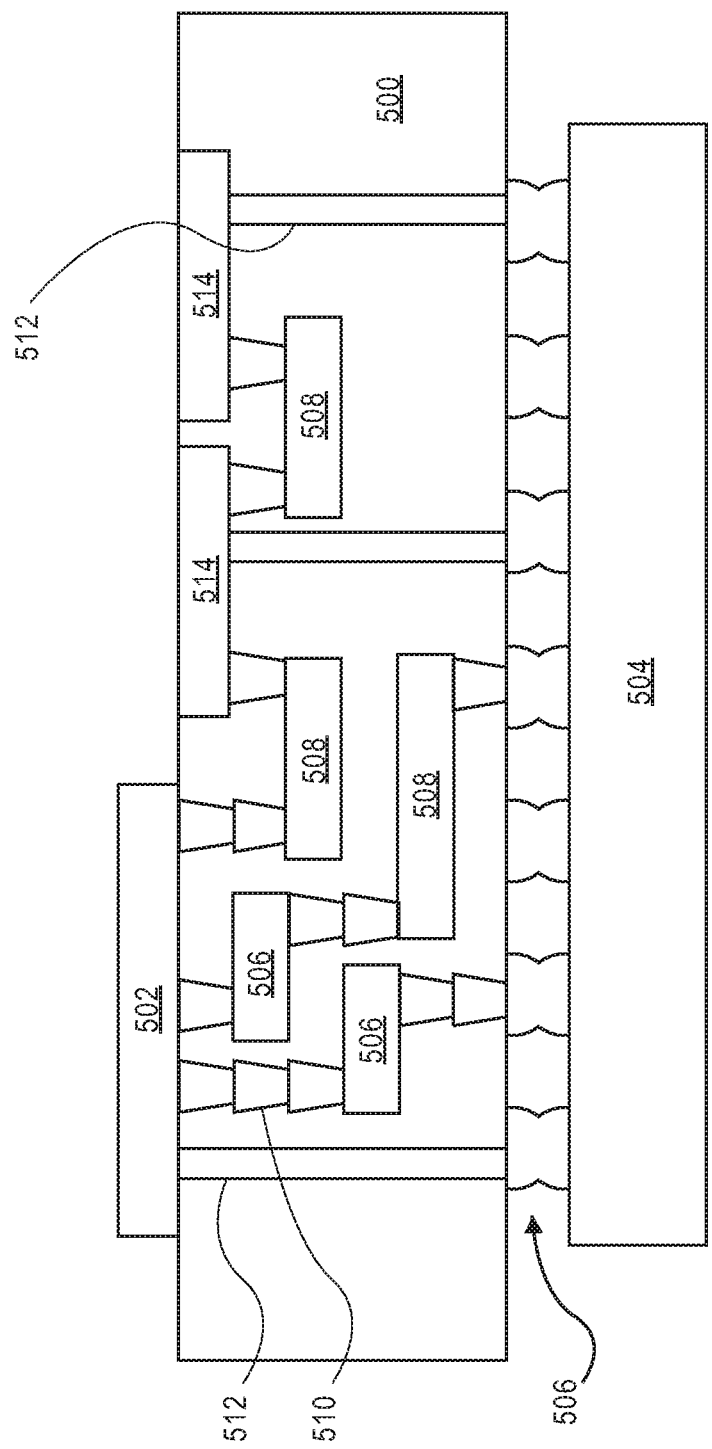
FIG. 5 is an interposer implementing one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Thus, embodiments of the present invention include grating based plugs and cuts for feature end formation for back end of line (BEOL) interconnects.

In an embodiment, a method of fabricating an interconnect structure for a semiconductor die includes forming a hardmask layer above an interlayer dielectric (ILD) material layer. A first patterned hardmask layer is formed above the hardmask layer, the first patterned hardmask layer having a grating pattern with a first direction. A second patterned hardmask layer is formed above the first patterned hardmask layer, the second patterned hardmask layer having a grating pattern with a second direction orthogonal to the first direction. A lithographic patterning mask is formed above the second patterned hardmask layer, the lithographic patterning mask having regions protecting selected line end locations for the ILD material layer. Portions of the second patterned hardmask layer not protected by the regions of the lithographic patterning mask are removed to form a third patterned hardmask layer and then the lithographic patterning mask is removed. A combined pattern of the third patterned hardmask layer and the first patterned hardmask layer is transferred to the hardmask layer and to the ILD material layer.

In one embodiment, the method further includes removing the third patterned hardmask layer and the first patterned hardmask layer, and forming metal lines in the patterned ILD layer, the metal lines having lines ends in the ILD material layer corresponding to the combined pattern of the third patterned hardmask layer and the first patterned hardmask layer.

In one embodiment, forming the metal lines includes connecting one or more of the metal lines to an underlying conductive via above an underlying metallization layer.

In one embodiment, the method further includes removing the hardmask layer, and forming a next metallization layer above the metal lines and the patterned ILD layer.

In one embodiment, forming the first patterned hardmask layer includes forming a primarily one dimensional grating pattern.

In one embodiment, the forming the second patterned hardmask layer includes forming a primarily one dimensional grating pattern.

In one embodiment, the grating pattern of the first patterned hardmask layer and the grating pattern of the second patterned hardmask layer together define all allowed line end locations for a metal line metallization layer.

In one embodiment, the grating pattern of the first patterned hardmask layer and the grating pattern of the second patterned hardmask layer together define line end locations at locations where lines of the grating pattern of the first patterned hardmask layer and the grating pattern of the second patterned hardmask overlap.

In one embodiment, the grating pattern of the first patterned hardmask layer and the grating pattern of the second patterned hardmask layer together define line end locations at locations where spaces are exposed between lines of the grating pattern of the first patterned hardmask layer and the grating pattern of the second patterned hardmask layer.

In one embodiment, forming the second patterned hardmask layer includes using a pitch division processing scheme.

In one embodiment, forming the lithographic patterning mask includes forming the regions protecting the selected line end locations for the ILD material layer larger than the line ends formed in the patterned ILD layer.

In an embodiment, a method of fabricating an interconnect structure for a semiconductor die includes forming a hardmask layer above a sacrificial material layer. A first patterned hardmask layer is formed above the hardmask layer, the first patterned hardmask layer having a grating pattern with a first direction. A second patterned hardmask layer is formed above the first patterned hardmask layer, the second patterned hardmask layer having a grating pattern with a second direction orthogonal to the first direction. A lithographic patterning mask is formed above the second patterned hardmask layer, the lithographic patterning mask having openings exposing selected line end locations for the sacrificial material layer. Portions of the first patterned hardmask layer not protected by the openings of the lithographic patterning mask are removed to form a third patterned hardmask layer, wherein exposed regions of the second patterned hardmask layer also exposed by the openings confine the removal of the portions of the first patterned hardmask layer. The lithographic patterning mask and the second patterned hardmask layer are removed. A pattern of the third patterned hardmask layer is transferred to the hardmask layer and to the sacrificial material layer.

In one embodiment, the sacrificial material layer is a mask material layer, and the method further includes transferring a pattern of the patterned sacrificial material layer to an underlying permanent interlayer dielectric (ILD) material layer.

In one embodiment, the method further includes forming metal lines in the patterned permanent ILD layer, the metal lines having lines ends in the ILD material layer corresponding to the pattern of the third patterned hardmask layer.

In one embodiment, forming the metal lines includes connecting one or more of the metal lines to an underlying conductive via above an underlying metallization layer.

In one embodiment, forming the first patterned hardmask layer includes forming a primarily one dimensional grating pattern.

In one embodiment, forming the second patterned hardmask layer includes forming a primarily one dimensional grating pattern.

In one embodiment, the grating pattern of the first patterned hardmask layer and the grating pattern of the second patterned hardmask layer together define all allowed line end locations for a metal line metallization layer.

In one embodiment, forming the second patterned hardmask layer includes using a pitch division processing scheme.

In one embodiment, forming the lithographic patterning mask includes forming the openings exposing the selected line end locations for the ILD material layer larger than the line ends formed in the patterned ILD layer.

In an embodiment, a mask for line end formation of a metal line layer of an interconnect structure for a semiconductor die includes a first patterned hardmask layer above an underlying structure. The first patterned hardmask layer having a grating pattern with a first direction. A second patterned hardmask layer is above the first patterned hardmask layer. The second patterned hardmask layer has a grating pattern with a second direction orthogonal to the first direction. The grating pattern of the first patterned hardmask layer and the grating pattern of the second patterned hardmask layer together define all allowed line end locations for the metal line layer.

In one embodiment, the grating pattern of the first patterned hardmask layer and the grating pattern of the second patterned hardmask layer together define line end locations at locations where lines of the grating pattern of the first patterned hardmask layer and the grating pattern of the second patterned hardmask overlap.

In one embodiment, the grating pattern of the first patterned hardmask layer and the grating pattern of the second patterned hardmask layer together define line end locations at locations where spaces are exposed between lines of the grating pattern of the first patterned hardmask layer and the grating pattern of the second patterned hardmask layer.

In one embodiment, the first patterned hardmask layer is formed above an interlayer dielectric (ILD) material layer of the underlying structure.

In one embodiment, the first patterned hardmask layer is formed on hardmask layer formed on the ILD material layer of the underlying structure.

What is claimed is:

1. A method of fabricating an interconnect structure for a semiconductor die, the method comprising:
    forming a hardmask layer above an interlayer dielectric (ILD) material layer;
    forming a first patterned hardmask layer above the hardmask layer, the first patterned hardmask layer having a grating pattern with a first direction;
    forming a second patterned hardmask layer above the first patterned hardmask layer, the second patterned hardmask layer having a grating pattern with a second direction orthogonal to the first direction;
    forming a lithographic patterning mask above the second patterned hardmask layer, the lithographic patterning mask having regions protecting selected line end locations for the ILD material layer;
    removing portions of the second patterned hardmask layer not protected by the regions of the lithographic patterning mask to form a third patterned hardmask layer and then removing the lithographic patterning mask; and
    transferring a combined pattern of the third patterned hardmask layer and the first patterned hardmask layer to the hardmask layer and to the ILD material layer.

2. The method of claim 1, further comprising:
    removing the third patterned hardmask layer and the first patterned hardmask layer; and
    forming metal lines in the patterned ILD layer, the metal lines having lines ends in the ILD material layer corresponding to the combined pattern of the third patterned hardmask layer and the first patterned hardmask layer.

3. The method of claim 2, wherein forming the metal lines comprises connecting one or more of the metal lines to an underlying conductive via above an underlying metallization layer.

4. The method of claim 2, further comprising:
    removing the hardmask layer; and
    forming a next metallization layer above the metal lines and the patterned ILD layer.

5. The method of claim 1, wherein forming the first patterned hardmask layer comprises forming a primarily one dimensional grating pattern.

6. The method of claim 1, wherein forming the second patterned hardmask layer comprises forming a primarily one dimensional grating pattern.

7. The method of claim 1, wherein the grating pattern of the first patterned hardmask layer and the grating pattern of the second patterned hardmask layer together define all allowed line end locations for a metal line metallization layer.

8. The method of claim 7, wherein the grating pattern of the first patterned hardmask layer and the grating pattern of the second patterned hardmask layer together define line end locations at locations where lines of the grating pattern of the first patterned hardmask layer and the grating pattern of the second patterned hardmask overlap.

9. The method of claim 7, wherein the grating pattern of the first patterned hardmask layer and the grating pattern of the second patterned hardmask layer together define line end locations at locations where spaces are exposed between lines of the grating pattern of the first patterned hardmask layer and the grating pattern of the second patterned hardmask layer.

10. The method of claim 1, wherein forming the second patterned hardmask layer comprises using a pitch division processing scheme.

11. The method of claim 1, wherein forming the lithographic patterning mask comprises forming the regions protecting the selected line end locations for the ILD material layer larger than the line ends formed in the patterned ILD layer.

12. A method of fabricating an interconnect structure for a semiconductor die, the method comprising:
    forming a hardmask layer above a sacrificial material layer;
    forming a first patterned hardmask layer above the hardmask layer, the first patterned hardmask layer having a grating pattern with a first direction;
    forming a second patterned hardmask layer above the first patterned hardmask layer, the second patterned hardmask layer having a grating pattern with a second direction orthogonal to the first direction;
    forming a lithographic patterning mask above the second patterned hardmask layer, the lithographic patterning mask having openings exposing selected line end locations for the sacrificial material layer;
    removing portions of the first patterned hardmask layer not protected by the openings of the lithographic patterning mask to form a third patterned hardmask layer, wherein exposed regions of the second patterned hardmask layer also exposed by the openings confine the removal of the portions of the first patterned hardmask layer;
    removing the lithographic patterning mask and the second patterned hardmask layer; and
    transferring a pattern of the third patterned hardmask layer to the hardmask layer and to the sacrificial material layer.

13. The method of claim 12, wherein the sacrificial material layer is a mask material layer, the method further comprising:
  transferring a pattern of the patterned sacrificial material layer to an underlying permanent interlayer dielectric (ILD) material layer.

14. The method of claim 13, further comprising:
  forming metal lines in the patterned permanent ILD layer, the metal lines having lines ends in the ILD material layer corresponding to the pattern of the third patterned hardmask layer.

15. The method of claim 14, wherein forming the metal lines comprises connecting one or more of the metal lines to an underlying conductive via above an underlying metallization layer.

16. The method of claim 12, wherein forming the first patterned hardmask layer comprises forming a primarily one dimensional grating pattern.

17. The method of claim 12, wherein forming the second patterned hardmask layer comprises forming a primarily one dimensional grating pattern.

18. The method of claim 12, wherein the grating pattern of the first patterned hardmask layer and the grating pattern of the second patterned hardmask layer together define all allowed line end locations for a metal line metallization layer.

19. The method of claim 12, wherein forming the second patterned hardmask layer comprises using a pitch division processing scheme.

20. The method of claim 12, wherein forming the lithographic patterning mask comprises forming the openings exposing the selected line end locations for the ILD material layer larger than the line ends formed in the patterned ILD layer.

* * * * *